(12) United States Patent
Segal et al.

(10) Patent No.: US 6,723,187 B2
(45) Date of Patent: Apr. 20, 2004

(54) METHODS OF FABRICATING ARTICLES AND SPUTTERING TARGETS

(75) Inventors: Vladimir Segal, Veradale, WA (US); William B. Willett, Spokane, WA (US); Stephane Ferrasse, Veradale, WA (US)

(73) Assignee: Honeywell International Inc., Morristown, NJ (US)

(*) Notice: Subject to any disclaimer, the term of this patent is extended or adjusted under 35 U.S.C. 154(b) by 2 days.

(21) Appl. No.: 09/912,476

(22) Filed: Jul. 24, 2001

(65) Prior Publication Data

US 2001/0054457 A1 Dec. 27, 2001

Related U.S. Application Data

(62) Division of application No. 09/465,492, filed on Dec. 16, 1999.

(51) Int. Cl.$^7$ ............................... C22F 1/00; C22F 1/04
(52) U.S. Cl. .................. 148/538; 148/550; 148/557
(58) Field of Search .................. 148/538, 557, 148/550

(56) References Cited

U.S. PATENT DOCUMENTS

| | | |
|---|---|---|
| 3,497,402 A | 2/1970 | Douglass et al. |
| 3,653,981 A | 4/1972 | Watanabe et al. |
| 3,849,212 A | 11/1974 | Thornburg |
| 4,374,717 A | 2/1983 | Drauglis et al. |
| 4,466,940 A | 8/1984 | Siewert et al. |
| 4,517,032 A | 5/1985 | Goto et al. |
| 4,525,417 A | 6/1985 | Dimigen et al. |
| 4,619,695 A | 10/1986 | Oikawa et al. ............ 75/65 EB |
| 4,663,120 A | 5/1987 | Parent et al. |
| 4,762,558 A | 8/1988 | German et al. |
| 4,842,706 A | 6/1989 | Fukasawa et al. |
| 4,844,746 A | 7/1989 | Hormann et al. |
| 4,883,721 A | 11/1989 | Nalepka et al. |
| 4,889,745 A | 12/1989 | Sata |
| 4,960,163 A | 10/1990 | Fang et al. |
| 5,074,907 A | 12/1991 | Amato et al. |
| 5,087,297 A | 2/1992 | Pouliquen |
| 5,171,379 A | 12/1992 | Kumar et al. |
| 5,194,101 A | 3/1993 | Worcester et al. |
| 5,231,306 A | 7/1993 | Meikle et al. |
| 5,282,946 A | 2/1994 | Kinoshita et al. |
| 5,330,701 A | 7/1994 | Shaw et al. |
| 5,400,633 A | 3/1995 | Segal et al. ............... 72/272 |
| 5,413,650 A | 5/1995 | Jarrett et al. |
| 5,418,071 A | 5/1995 | Satou et al. |
| 5,456,815 A | 10/1995 | Fukuyo et al. |
| 5,468,401 A | 11/1995 | Lum et al. |
| 5,508,000 A | 4/1996 | Satou et al. |
| 5,513,512 A | 5/1996 | Segal ..................... 72/253.1 |
| 5,590,389 A | * 12/1996 | Dunlop et al. ............ 419/67 |
| 5,600,989 A | 2/1997 | Segal et al. ............. 72/253.1 |
| 5,608,911 A | 3/1997 | Shaw et al. |
| 5,623,726 A | 4/1997 | Kiiski et al. |

(List continued on next page.)

FOREIGN PATENT DOCUMENTS

| | | | |
|---|---|---|---|
| AU | 252442 | 9/1960 | |
| EP | 590904 | 4/1994 | ........ C23C/14/34 |
| EP | 882 813 | 12/1998 | |

(List continued on next page.)

OTHER PUBLICATIONS

B.D. Cullity, "Structure of Polycrystalline Aggregates", *Elements of X-ray Diffraction*, pp 294–297.

(List continued on next page.)

*Primary Examiner*—Roy King
*Assistant Examiner*—Harry D. Wilkins, III
(74) *Attorney, Agent, or Firm*—Wells St. John P.S.

(57) ABSTRACT

Described is a high quality sputtering target and method of manufacture which involves application of equal channel angular extrusion.

29 Claims, 10 Drawing Sheets

U.S. PATENT DOCUMENTS

| | | | |
|---|---|---|---|
| 5,673,581 A | 10/1997 | Setal ........................... | 72/184 |
| 5,693,203 A | 12/1997 | Ohhashi et al. | |
| 5,722,165 A * | 3/1998 | Kobayashi et al. ..... | 29/894.325 |
| 5,766,380 A | 6/1998 | Lo et al. | |
| 5,772,795 A | 6/1998 | Lally et al. | |
| 5,772,860 A | 6/1998 | Sawada et al. | |
| 5,780,755 A | 7/1998 | Dunlop et al. | |
| 5,798,005 A | 8/1998 | Murata et al. | |
| 5,809,393 A | 9/1998 | Dunlop et al. | |
| 5,826,456 A | 10/1998 | Kawazoe et al. | |
| 5,850,755 A | 12/1998 | Segal | |
| 5,993,575 A | 11/1999 | Lo et al. | |
| 5,993,621 A | 11/1999 | Liu | |
| 6,024,852 A | 2/2000 | Tamura et al. | |
| 6,085,966 A | 7/2000 | Shimomuki et al. | |
| 6,113,761 A | 9/2000 | Kardokus et al. | |
| 6,123,896 A | 9/2000 | Meeks, III et al. | |
| 6,139,701 A | 10/2000 | Pavate et al. | |
| 6,193,821 B1 | 2/2001 | Zhang | |
| 6,221,178 B1 | 4/2001 | Torizuka et al. | |
| 6,348,113 B1 | 2/2002 | Michaluk et al. | |
| 6,348,139 B1 | 2/2002 | Shah et al. | |
| 6,454,994 B1 | 9/2002 | Wang | |
| 6,521,173 B2 | 2/2003 | Kumar et al. | |
| 2001/0023726 A1 | 9/2001 | Koenigsmann et al. | |
| 2002/0041819 A1 | 4/2002 | Kumar et al. | |

FOREIGN PATENT DOCUMENTS

| | | | |
|---|---|---|---|
| EP | 0 902 102 A1 | 3/1999 | |
| EP | 0 281 141 B2 | 6/2000 | |
| JP | 55-179784 | 12/1980 | |
| JP | 59227992 A | 12/1984 | |
| JP | 62-297463 | 12/1987 | |
| JP | 03-082773 | 4/1991 | |
| JP | 3-197640 A | 8/1991 | |
| JP | 3-197640 | 8/1991 | |
| JP | 610107 | 1/1994 | |
| JP | 693400 | 4/1994 | |
| JP | 6256919 | 9/1994 | |
| JP | 06264232 | 9/1994 | |
| JP | 7-90566 | 4/1995 | |
| JP | 8-64554 | 3/1996 | |
| JP | 8-100255 | 4/1996 | |
| JP | 08-134606 | 5/1996 | |
| JP | 08146201 | 6/1996 | |
| JP | 08232061 | 6/1996 | |
| JP | 08269701 | 10/1996 | |
| JP | 10008244 | 1/1998 | |
| WO | WO 87/07650 | 12/1987 | |
| WO | 9201080 | 1/1992 | ........... C23C/14/35 |
| WO | WO 99/02743 | 1/1999 | |
| WO | WO 99/27150 | 6/1999 | |
| WO | WO 99/66100 | 12/1999 | |
| WO | WO 00/31310 | 6/2000 | |
| WO | WO 01-29279 A1 | 4/2001 | |

OTHER PUBLICATIONS

B.D. Cullity, "Structure of Polycrystalline Aggregates", *Elements of X–ray Diffraction*, pp 294–297.

"Heat Treating of Aluminum Alloys", from ASM Handbook vol. 4 Heat Treating, pub. by ASM International, 1991, pp. 841–879.*

Hughes et al., "Grain Subdivision and the Development of Local Orientations in Rolled Tantalum" Tantalum, The Minerals, Metals & Materials Society, 1996, pp. 257–262. (Year is sufficiently early so that the month is not an issue.).

Arlt, Jr., "Sulfonation and Sulfonation to Thorium and Thorium Compounds" Kirk–Othmer Encyclopedia of chemical Technology vol. 22, pp. 541–564, (1993, Year is sufficiently early so that the month is not an issue).

Kirkbride et al., "The Effect of Yitrium on the Recrystallization and Grain Growth of Tantalum", J. Less–Common Metals, vol. 9, pp. 393–408, 1965, (Year is sufficiently early so that the month is not an issue.).

National Research Corporation Press Release, pp. 1–4, Jul. 1964.

National Research Corporation Data Sheet "SGS Tatalum", pp. 1–7, no date.

ASTM Standard Specification for Tantalum and Tantalum Alloy Plate, Sheet, and Strip, pp. 558–561, 1992. (Year s sufficiently early so that the month is not an issue.).

Kumar, et al. "Effect of Intermetallic Compounds of the Properties of Tantalum" Materials Research Society Symposium Proceedings, vol. 322, pp. 413–422, 1994. (Year is sufficiently early so that the month is not an issue.).

Kumar, et al. "Effect of Intermetallic Compounds of the Properties of Tantalum"Refractory Metals & Hard Materials, vol. 12, pp. 35–40, 1994. (Year is sufficiently early so that the month is not an issue.).

Klein et al., "Inhomogeneous Textures in Tantalum Sheets" Materials Science Forum, vol. 157–162, pp. 1423, (1994).(Year is sufficiently early so that the month is not an issue.).

Clark et al., "Influence of Transverse Rolling on the Microstructural and Texture Development in Pure Tantalum", Metallurgical Transactions, vol. 23A, pp. 2183–2191. Aug. 1992.

Raabe, et al., "Texture and Microstructure of Rolled and Annealed Tantalum", Materials Science and Technology, vol. 10, pp. 299–305, Apr. 1994.

Wright et al., "Texture Gradient Effects in Tantalum", International Conference on Textures of Materials, 7 pgs., Sep. 1993.

Wright et al., "Textural and Microstructural Gradient Effects on the Mechanical Behavior of a Tantalum Plate", Metallurgical Transactions A, 25A (1994), pp. 1–17. (Year is sufficiently early so that the month is not an issue.).

Clark et al., "Effect of Processing Variables on Texture and Texture Gradients in Tantalum", Metallurgical Transactions A, vol. 22A, Sep. 1991, pp. 2039–2047).

Kumar et al., "Corrosion Resistant Properties of Tantalum" Corrosion 95, Paper No. 253, 14 pages. (No date).

Material Evaluation Report, Ingot No. T891C, Mar. 25, 1998, 1 page.

Canonico, "Stress–Relief Heat Treating of Steel", ASM Handbook vol. 4: Heat Treating ASM International, 1991, pp. 33–34.

C. Klein et al., "Manual of Mineralogy", pp 39–40.

S. Wright et al. Effect of Annealing Temperature on the Texture of Rolled Tantalum and Tantalum–10 Wt.% Tungstun, reprinted from *Tungsten and Refractory Metals 2*, pp 501–508.

H–R Wenk, "Preferred Orientation in Deformed Metals and Rocks: An Introduction to Modern Texture Analysis", 1985, pp 8–10.

Ferrasse, S. et al., "Microstructure and Properties of Copper and Aluminum Alloy 3003 Heavily Worked by Equal Channel Angular Extrusion", Metallurgical and Materials Transactions A, vol. 28A, Apr. 1997, pp. 1047–1057.

Pavate et al., "Correlation between Aluminum alloy sputtering target metallurgical characteristics, Arc initiation, and In–film defect density", SPIE vol. 3214, 1997, pp. 42–47.

Mukai, T. et al, "Dynamic Mechanical Properties of a Near–Nano Aluminum Alloy Processed by Equal–Channel–Angular–Extrusion", Nano–Structured Materials, vol. 10, No. 5, pp. 755–765 (1998) Elsevier Science Ltd.

Hatch, J.E., *Aluminum*, 1984, Chap. 5, "Metallurgy of Heat Treatment and General Principles of Precipitation Hardening", pp. 134–157, 175–183.

Ferrasse, S. et al., "Development of a Submicrometer-Grained Microstructure in Aluminum 6061 Using Equal Channel Angular Extrusion", J. Mater. Res. vol. 12, No. 5, May 1997, pp. 1253–1261.

V.M. Segal, "Materials Processing by Simple Shear", Materials Science and Engineering A, vol. 197, 1995, pp. 157–164. (Year is sufficiently early so that the month is not an issue.).

Ruglic, "Normalizing of Steel" ASM Handbook, vol. 4 Heat Treating, 1991, pp. 35–41.

"Nickel, Cobalt and Their Alloys", pub, by ASM International, Dec. 2000, pp. 7a, 130–234.

Susumu Sawada, "On Advanced Sputtering Targets of Refractory Metals and Their Silicides for VLSI–Applications", $12^{th}$ International Plansee Seminar (1989) Topic 5: Ultrapure Refractory Metals, pp. 201–222.

P. Ding et al., "Cooper Barrier, Seed Layer, and Planarization Technologies", Jun. 10–12, 1997 VMIC Conference, pp. 87–92.

Friedman, "Grain Size Refinement in a Tantalum Ingot", Metallurgical Transactions, vol. 2 No. 1, Jan. 1971, pp. 337–341.

* cited by examiner

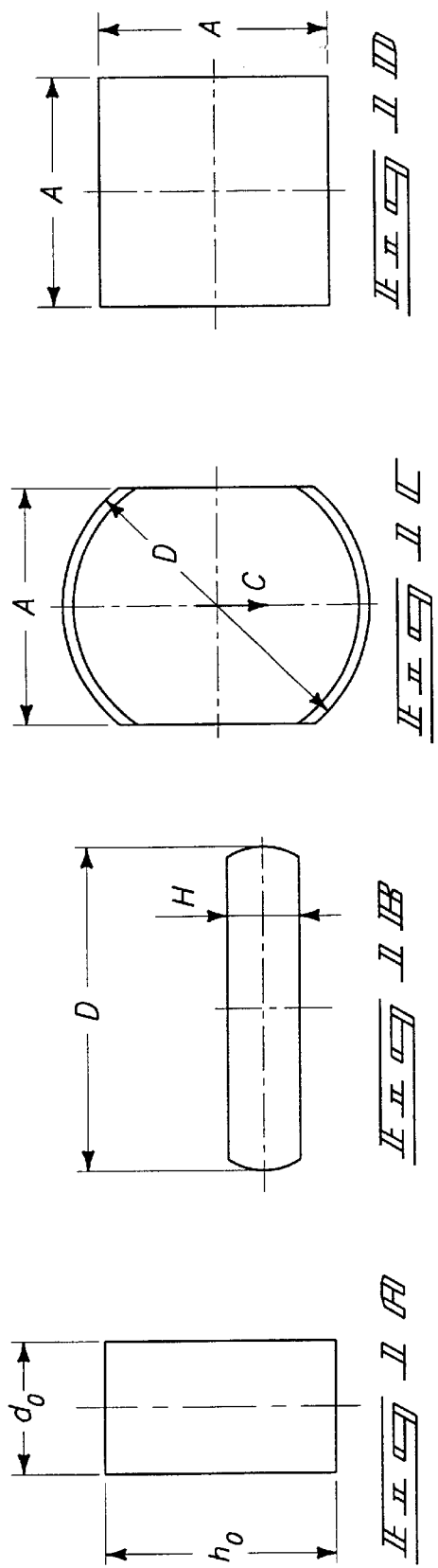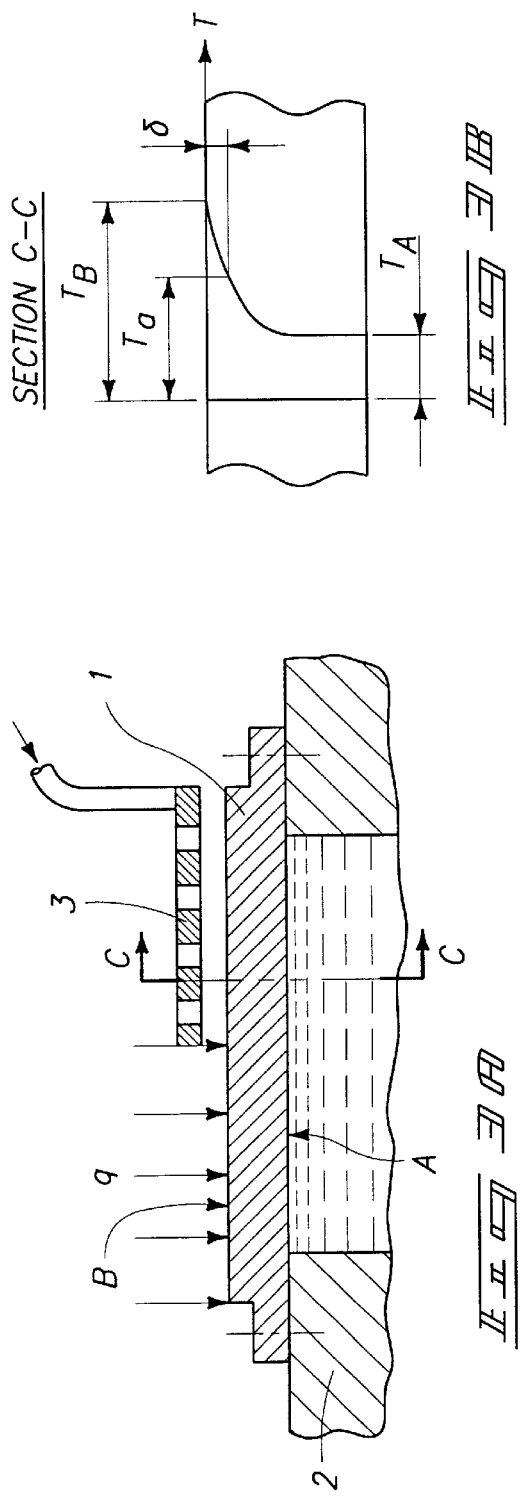

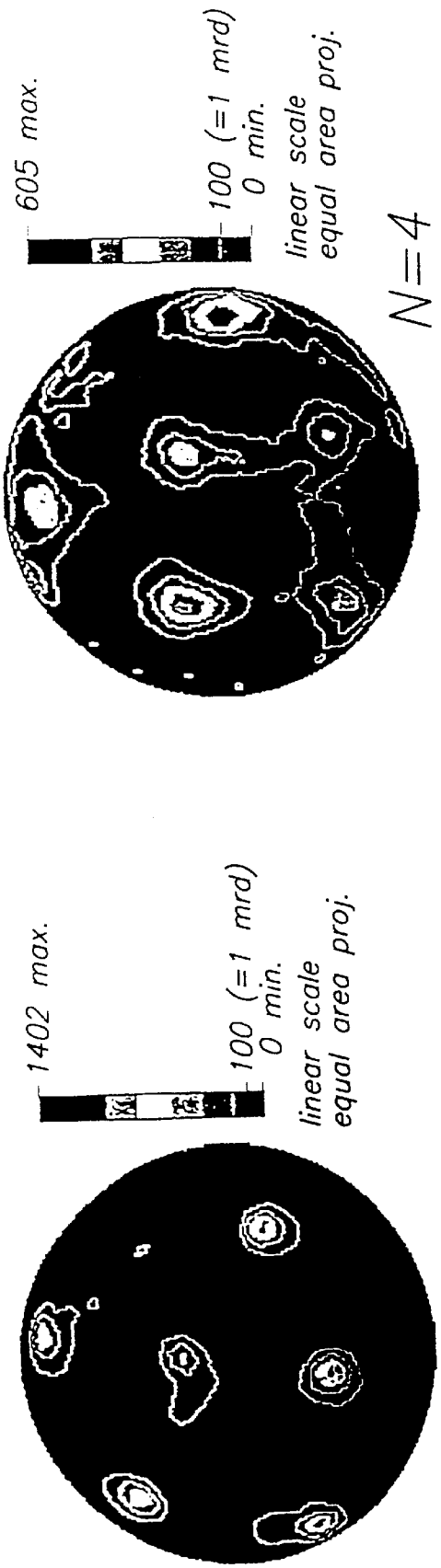
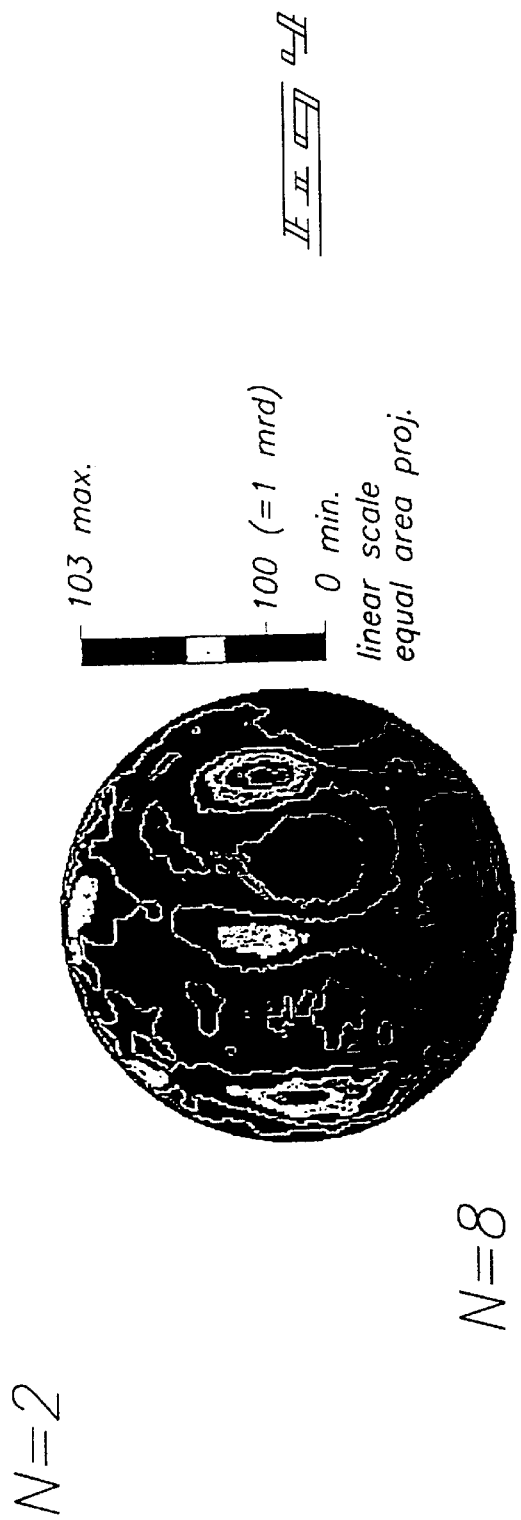
FIG. 4

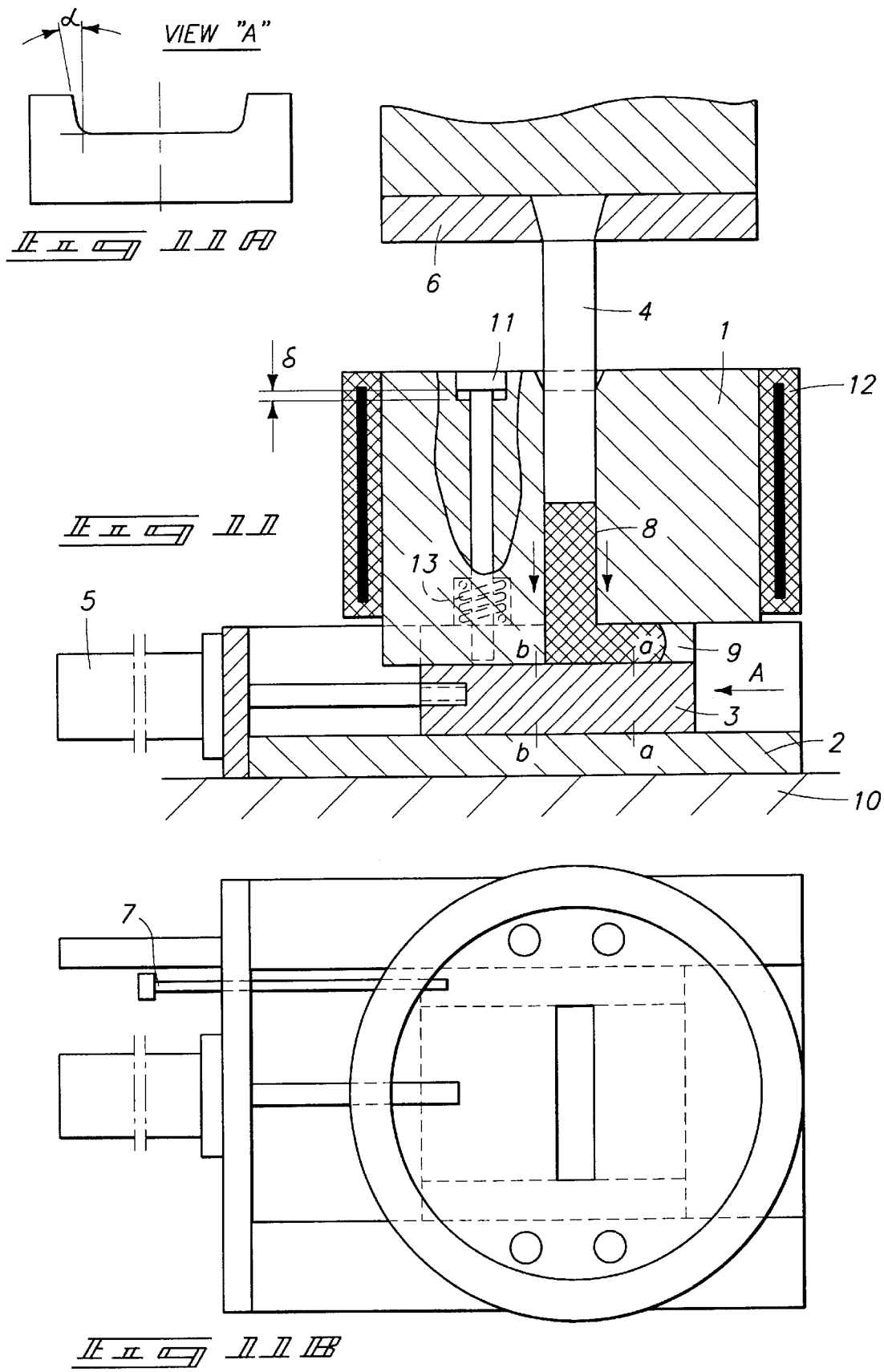

METHODS OF FABRICATING ARTICLES AND SPUTTERING TARGETS

CROSS REFERENCE TO RELATED APPLICATIONS

This application is a divisional of U.S. patent application Ser. No. 09/465,492, filed Dec. 16, 1999; which is related to application Ser. No. 09/098,761, filed Jun. 17, 1998.

This application is related to application Ser. No. 09/098,761, filed Jun. 17, 1998.

BACKGROUND OF THE INVENTION

The invention relates to sputtering targets and methods of making same; and to sputtering targets of high purity metals and alloys. Among these metals are Al, Ti, Cu, Ta, Ni, Mo, Au, Ag, Pt and alloys thereof, including alloys with these and or other elements. Sputtering targets may be used in electronics and semiconductor industries for deposition of thin films. To provide high resolution of thin films, uniform and step coverages, effective sputtering rate and other requirements, targets should have homogenous composition, fine and uniform structure, controllable texture and be free from precipitates, particles and other inclusions. Also, they should have high strength and simple recycling. Therefore, significant improvements are desired in the metallurgy of targets especially of large size targets.

A special deformation technique known as equal channel angular extrusion (ECAE) described in U.S. Pat. Nos. 5,400,633; 5,513,512; 5,600,989; and U.S. Pat. No. 5,590,389 is used with advantage in accordance with the invention. The disclosures of the aforementioned patents are expressly incorporated herein by reference.

SUMMARY OF THE INVENTION

The invention relates to a sputtering target made by a process including casting. The target has a target surface such that the surface of the target subjected to sputtering (referred to as target surface) has a substantially homogeneous composition at any location, substantial absence of pores, voids, inclusions and other casting defects, grain size less than about 1 μm and substantially uniform structure and texture at any location. Preferably, the target comprises at least one of Al, Ti, Cu, Ta, Ni, Mo, Au, Ag, Pt and alloys thereof.

The invention also relates to a method of manufacturing a target, as described above. The method comprises fabricating an article suitable for use as a sputtering target comprising the steps of:
a. providing a cast ingot;
b. homogenizing said ingot at time and temperature sufficient for redistribution of macrosegregations and microsegregations; and
c. subjecting said ingot to equal channel angular extrusion to refine grains therein.

More particularly, a method of making a sputtering target comprising the steps of:
a. providing a cast ingot with a length-to-diameter ratio up to 2;
b. hot forging said ingot with reductions and to a thickness sufficient for healing and full elimination of case defects;
c. subjecting said hot forged product to equal channel extrusion; and
d. manufacturing into a sputtering target.

Still more particularly, a method of fabricating an article suitable for use as a sputtering target comprising the steps of:
a. providing a cast ingot;
b. solutionizing heat treating said cast ingot at temperature and time necessary to dissolve all precipitates and particle bearing phases; and
c. Equal channel angular extruding at temperature below aging temperatures.

After fabricating as described to produce an article, it may be manufactured into a sputtering target.

DESCRIPTION OF THE DRAWINGS

FIGS. 1A–1D are schematic diagrams showing processing steps of billet preparation for ECAE;

FIG. 3A is a schematic diagram disclosing an apparatus for gradient annealing of targets;

FIG. 3B is a schematic diagram showing temperature distribution through target cross-section C—C during gradient annealing;

FIG. 4 is an illustration of (200) pole figures for Al 0.5 wt. % Cu alloys processed with 2, 4 and 8 passes of route D, (in FIG. 5) respectively;

FIGS. 11, 11A and 11B are schematic diagrams of an apparatus for ECAE of billets for targets.

DETAILED DESCRIPTION

Figure 2:
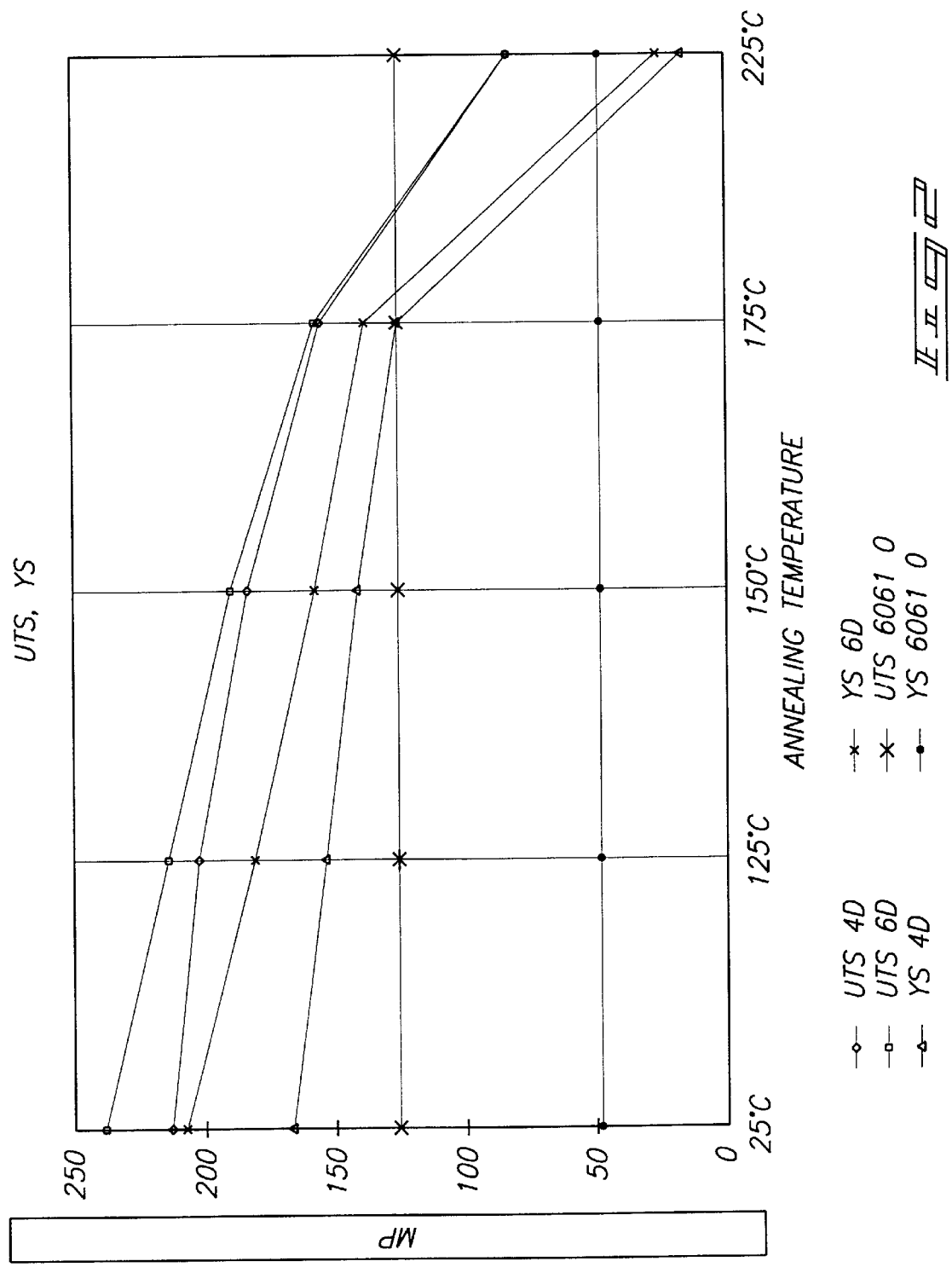
FIG. 2 is a graph showing the effect of annealing temperature on billet strength after 4 and 6 passes of ECAE for Al 0.5 wt. % Cu alloy.

The invention contemplates a sputtering target having the following characteristics:

substantially homogenous material composition at any location;

substantial absence of pores, voids, inclusions and other casting defects;

substantial absence of precipitates;

grain size less than about 1 μm;

fine stable structure for sputtering applications;

substantially uniform structure and texture at any location;

high strength targets without a backing plate;

controllable textures from strong to middle, weak and close to random;

controllable combination of grain size and texture;

large monolithic target size;

prolonged sputtering target life;

optimal gradient of structures through target thickness. Targets possessing these characteristics are producible by the processes described.

Because of high purity, cast ingot metallurgy is useful in most cases for billet fabrication in target production. However, casting results in a very course dendritic structure with strong non-uniformity in the distribution of constitutive elements and additions across the ingot and large crystallites. Moreover, high temperature and long-time homogenizing cannot be applied in current processing methods because of the further increase of grains. One embodiment of the invention solves this problem by using homogenizing time and temperature sufficient for redistribution of macrosegregations and microsegregations followed by equal channel angular extrusion (ECAE) with a sufficient number of passes, preferably from 4 to 6, for grain refinement.

Another embodiment eliminates other casting defects such as voids, porosity, cavities and inclusions which cannot be optimally removed by homogenizing and employs a hot forging operation. In currently known methods hot forging has a restricted application because reductions are limited and are typically used at low temperature working for grain refinement. Other processes do not solve that problem when slab ingots of the same thickness as the billet for ECAE are used. In the present invention, the as-cast ingot has a large length-to-diameter ratio, preferably up to 2. During hot forging, the ingot thickness changes to the thickness of the billet for ECAE. That provides large reductions which are sufficient for full healing and elimination of cast defects.

Still another embodiment of the invention is directed to precipitate- and particle-free targets. With currently known methods precipitate-free material may be prepared by solutionizing at the last processing step. However, in this case heating to solutionizing temperatures produces very large grains. The present invention provides a method for fabricating precipitate-free and ultra-fine grained targets. According to this embodiment of-the invention, solutionizing is performed at a temperature and time necessary to dissolve all precipitates and particle bearing phases and is followed by quenching immediately before ECAE. Subsequent ECAE and annealing are performed at temperatures below aging temperatures for corresponding material conditions.

A further embodiment of the invention is a special sequence of homogenizing, forging and solutionizing operations. As-cast ingots are heated and soaked at the temperature and for the length of time necessary for homogenizing, then cooled to the starting forging temperature, then forged to the final thickness at the final forging temperature (which is above the solutionizing temperature) and quenched from this temperature. By this embodiment all processing steps are performed with one heating. This embodiment also includes another combination of processing steps without homogenizing: forging at a temperature of about the solutionizing temperature and quenching immediately after forging.

It is also possible in accordance with the invention to conduct aging after solutionizing at the temperature and for the length of time necessary to produce fine precipitates with an average diameter of less than 0.5 $\mu$m. These precipitates will promote the development of fine and uniform grains during following steps of ECAE An additional embodiment of the invention is a billet for ECAE after forging. An as-cast cylindrical ingot of diameter do and length $h_o$ (FIG. 1A) is forged into a disk of diameter D and thickness H (FIG. 1B). The thickness H corresponds to the thickness of the billet for ECAE. Then two segments are removed from two opposite sides of the forged billet such as by machining or sawing (FIG. 1C), to provide a dimension A corresponding to a square billet for ECAE (FIG. 1D). ECAE is performed in direction "C" shown on FIG. 1C. After the first pass the billet has a near-square shape if the dimensions of the ECAE billet (A×A×H), the dimensions of the forged disk (D×H) and the dimensions of the cast ingot ($d_o$×$h_o$) are related by the following formulae:

$$D=1.18A$$

$$d_o{}^2h_o=1.39A^2H$$

The invention further contemplates the fabrication of targets with fine and uniform grain structure. ECAE is performed at a temperature below the temperature of static recrystallization with the number of passes and processing route adjusted to provide dynamic recrystallization during ECAE. Processing temperature and speed are, correspondingly, sufficiently high and sufficiently low to provide macro- and micro-uniform plastic flow.

A method for fabricating fine and stable grain structures for sputtering applications and to provide high strength targets is also provided. The billet after ECAE with dynamically recrystallized sub-micron structure is additionally annealed at the temperature which is equal to the temperature of the target surface during steady sputtering. Therefore, the temperature of the target cannot exceed this sputtering temperature and for structure to remain stable during target life. That structure is the finest presently possible stable structure and provides the best target performance. It also provides a high strength target. FIG. 2 shows the effect of the annealing temperature on the ultimate tensile strength and yield stress of Al 0.5 wt. % Cu alloy after ECAE at room temperature with 6 or 4 passes. In both cases as-processed material has high strength not attainable for that material with known methods. Yield stress is only slightly glower than ultimate tensile strength. The increase of the annealing temperature in a range from 125° C. to 175° C. that, it is believed, corresponds to possible variations of sputtering temperature results in the gradual decrease of strength. However, even in the worst case with an annealing temperature of 175° C. target strength and, especially, yield stress are much higher than the strength of aluminum alloy AA6061 at T-O condition which is the most widely used for fabrication of backing plates (see FIG. 2). Thus, among other things, the invention provides the following significant advantages:

High strength monolithic targets may be fabricated from mild materials like pure aluminum, copper, gold, platinum, nickel, titanium and their alloys.

It is not necessary to use backing plates with additional and complicated operations such as diffusion bonding or soldering.

Fabrication of large targets is not a problem.

Targets may easily be recycled after their sputtering life ends.

It is also useful to employ gradient annealing of targets after ECAE. For that purpose a preliminary machined target is exposed to the same thermal conditions as under sputtering conditions and kept at those conditions a sufficient time for annealing. FIG. 3 describes that processing. The target 1 is fixed in a device 2 which simulates sputtering: a bottom surface A of the target is cooled by water while a top surface B is heated to the sputtering temperature. Heating is advantageously developed at the thin surface layer by radiant energy q (left side of FIG. 3A) or inductor 3 (right side of FIG. 3A) In addition it is also possible to achieve gradient annealing of targets directly in a sputtering machine at the regular sputtering conditions before starting the production run. In all these cases distribution of temperature through the target as shown in FIG. 3B through sections C—C of FIG. 1 is non-uniform and annealing takes place only inside a very thin surface layer (δ). Following sputtering the same distribution is maintained automatically. Thus, structural stability and high strength of as-processed material are conserved for the main part of the target.

An additional embodiment comprises a two-step ECAE processing. At the first step ECAE is performed with a low number of passes, preferably from 1 to 3, in different directions. Then, the preliminary processed billet receives aging annealing at low enough temperatures but for sufficient time to produce very fine precipitates of average diameter less than about 0.1 μm. After intermediate annealing ECAE is repeated with the number of passes necessary to develop a dynamically recrystallized structure with the desired fine and equiaxed grains.

It is also possible through use of the invention to control texture. Depending on the starting texture and the nature of the materials, various textures can be created. Four major parameters are important to obtain controlled textures:

Parameter 1: the number of repeated ECAE passes subjected to the same work piece. This number determines the amount of plastic deformation introduced at each pass. Varying the tool angle between the two channels of the ECAE equipment enables the amount of plastic straining to be controlled and determined and therefore represents an additional opportunity for producing specific textures. Practically, in most cases, a tool angle of about 90° is used since an optimal deformation (true shear strain ε=1.17) can be attained;

Parameter 2: the ECAE deformation route; that is defined by the way the work piece is introduced through the die at each pass. Depending on the ECAE route only a selected small number of shear planes and directions are acting at each pass during plastic straining.

Parameter 3: annealing treatment that comprises heating the work piece under different conditions of time and temperature. Both post-deformation annealing at the end of the ECAE extrusion and intermediate annealing between selected ECAE passes are effective ways to create various textures. Annealing causes the activation of different metallurgical and physical mechanisms such as second-phase particle growth and coalescence, recovery and static recrystallization, which all affect more or less markedly the microstructure and texture of materials. Annealing can also create precipitates or at least change the number and size of those already present in the material: this is an additional way to control textures.

Parameter 4: the original texture of the considered material.

Parameter 5: the number, size and overall distribution of second-phase particles present inside the material.

With consideration of these five major parameters, control of texture is possible in the ways described below:

Table 1 describes major components of texture between 1 and 8 ECAE passes via routes A through D in the as deformed condition for a strong initial texture and also for routes A and D for a weak initial texture. To describe major components both the 3 Euler angles (αβγ) according to the Roe/Matthies convention and ideal representation {xyz}<uvw> are used. Moreover, the total volume percentage of the component is given. For texture strength both the OD index and Maximum of pole figures are given.

TABLE 1

| Number of passes N | Major Texture Orientations Notation: Euler angles (αβγ):{xyz}<uvw>:% total volume with 5° spread | OD index (t.r.) | Maximum of Pole Figures (t.r.) |
|---|---|---|---|
| | Texture strength and orientation for route A as a function of the number of passes and initial texture ROUTE A (STRONG INITIAL TEXTURE) | | |
| Original (N = 0) | (10.9 54.7 45):(−111)<1−23>:16% <br> (105 26.5 0):(−102)<−28−1>:14% <br> (110 24 26.5):(−215)<−5−5−1>9.3% | 21.7 | 17.02 |
| N = 1 | (119 26.5 0):(−102)<−2−4−1>:17.62% <br> (346 43.3 45):(−223)<2−12>:7.62% | 10.9 | 10.9 |
| N = 2 | (138 26.5 0):(−102)<−2−2−1>:8.66% <br> (31 36.7 26.5):(−213)<−3−64>:8.6% | 6.1 | 6.9 |
| N = 3 | (126.7 26.5 0):(−102)<−2−3−1>:7.45% <br> (21 36.7 26.5):(−213)<2−43>:6.1% | 5.79 | 5.45 |
| N = 4 | (26.5 36.7 26.5):(−213)<2−64>:9.42% <br> (138 26.5 0):(−102)<−2−2−1>:4.62% <br> 169 15.8 45):(−115)<−32−1>:4.32% | 4.82 | 6.55 |
| N = 6 | (126.7 26.5 0):(−102)<−2−3−1>:6.66% <br> (228 33.7 0):(−203)<−34−2>:5.8% <br> (31 36.7 26.5):(−213)<3−64>:3.42% | 3.94 | 5.61 |
| N = 8 | (0 35.2 45):(−112)<1−11>:3.1% <br> (180 19.4 45):(−114)<−22−1>:3.06% <br> (31 25.2 45):(−113)<1−52>:2.2% | 2.05 | 3.5 |
| | ROUTE A (WEAK INITIAL TEXTURE) | | |
| Original (N = 0) | (80 25.2 45):(−113)<8−11 1>:4.3% <br> Large spreading around (106) (119) | 2.6 | 3.2 |
| N = 1 | (0 46.7 45):(−334)<2−23>:5.8% <br> (222 26.5 0):(−102)<−22−1>:5% <br> (128 18.4 0):(−103)<−3−4−1>:4.01% | 4.02 | 6.3 |
| N = 2 | (126.7 26.5 0):(−102)<−2−3−1>:6.22% <br> (26.5 48.2 26.5):(−212)<1−22>:5.4% <br> (162 13.2 45):(−116)<−42−1>:5.4% | 4.4 | 6.8 |

TABLE 1-continued

| Number of passes N | Major Texture Orientations Notation: Euler angles (αβγ):{xyz}<uvw>:% total volume with 5° spread | OD index (t.r.) | Maximum of Pole Figures (t.r.) |
|---|---|---|---|
| N = 4 | (226 36.7 26.5):(−213)<−12−1>:4.85% (233 26.5 0):(−102)<−23−1>:4.63% (136 19.5 45):(−114)<−40−1>:4.54% (26.5 36.7 26.5):(−213)<2−64>:3.7% | 3 | 5.1 |

Texture strength and orientation for route B
as a function of the number of passes and initial texture

ROUTE B (STRONG INITIAL TEXTURE)

| | | | |
|---|---|---|---|
| Original (N = 0) | (10.9 54.7 45):(−111)<1−23>:16.4% (105 26.5 0):(−102)<−2−8−1>:14% (110 24 26.5):(−215)<−5−5−1>:9.3% | 21.7 | 17.02 |
| N = 1 | (119 26.5 0):(−102)<−2−4−1>:17.62% (346 43 45):(−223)<2−12>:7.62% | 10.9 | 10.9 |
| N = 2 | (0 48 26.5):(−212)<425>P24.24% (216 15.8 45):(−115)<−24−1>:8.07% (138 26.5 0):(−102)<−2−2−1>:5.04% | 17.27 | 14.02 |
| N = 3 | (260 36 74):(−2 7 10)<94−1>:15.49% (118 18.4 90):(013)<−63−1>:5.23% | 7.3 | 9.1 |
| N = 4 | (96 36 16):(−7 2 10)<−6−15−1>:12% (187 15.6 26.5):(−21−8)<−32−1>:8.05% | 6 | 9.77 |
| N = 6 | (230.5 14 0):(−104)<−45−1>:12.46% (100 36 16)(−7 2 10)<−4−9−1>:10.2% | 6.3 | 8.45 |
| N = 8 | (230.5 14 0):(−104)<−45−1>:9.19% (180 13.2 45):(−116)<−33−1>:8.21% (100 36 16):(−7 2 10)<−4−9−1>:7.48% | 4.9 | 6.99 |

Texture strength and orientation for route C
as a function of the number of passes and initial texture

ROUTE C (STRONG INITIAL TEXTURE)

| | | | |
|---|---|---|---|
| Original (N = 0) | (10.9 54.7 45):(−111)<1−23>:16.4% (105 26.5 0):(−102)<−2−8−1>:14% (110 24 26.5):(−215)<−5−5−1>:9.3% | 21.7 | 17.02 |
| N = 1 | (119 26.5 0):(−102)<−2−4−1>:17.62% (346 43 45):(−223)<2−12>:7.62% | 10.9 | 10.9 |
| N = 2 | (0 34.5 14):(−416)<4−13>:43.3% (221.8 265 0):(−102)<−2 2 −1>:10.5% | 48.9 | 25.9 |
| N = 3 | (254 148.4 0):(−103)<−3 11 −1>:7.5% (111.5 46.5 18.4):(−313)<−2−3−1>:6.6% | 5.2 | 6.05 |
| N = 4 | (130 36.9 10):(−304)<−4−6−3 >:15.05% | 7.95 | 13.3 |
| N = 5 | Large spreading (270 14 0):(−104)<010>:4.66% (26.548 26.5):(−212)<1−22>:2.54% | 2.4 | 3.3 |
| N = 6 | (110 36 16):(−7 2 10)<−5−8−2>:11.6% (234 33.7 0):(−203)<−35−2>:5.7% | 6.32 | 9.3 |
| N = 7 | Large spreading (242 18.4 0):(−103)<−36−1>:4.66% (188 11.4 45):(−117)<−34−1>:3.36% | 2.35 | 3.15 |
| N = 8 | (136.5 18.4 0):(−103)<−331>:14.71% (257 45 0):(−101)<−8 49 −8>:8.75% | 12.9 | 11 |

Texture strength and orientation for route D
as a function of the number of passes and initial texture

ROUTE D (STRONG INITIAL TEXTURE)

| | | | |
|---|---|---|---|
| Original (N = 0) | (10.9 54.7 45):(−111)<1−23>16.4% (105 26.5 0):(−102)<−2−8−1>:14% (110 24 26.5):(−215)<−5−51>:9.3% | 21.7 | 17.02 |
| N = 1 | (119 26.5 0):(−102)<−2−4−1>:17.62% (346 43 45):(−223)<2−12>:7.62% | 10.9 | 10.9 |
| N = 2 | (0 48 26.5):(−212)<425>:24.24% (216 15.8 45):(−115)<−2 4 −1>:8.07% (138 26.5 0):(−102)<−2−2−1>5.04% | 17.27 | 14.02 |
| N = 3 | (197 20.4 26.5):(−216)<−22−1>9.57% all other components < 3% | 3.91 | 6.67 |
| N = 4 | (222 26.5 0):(−102)<−22−1>:13.34% all other components < 3.8% | 6.346 | 7.36 |
| N = 6 | (223.5 18.5 0):(−103)<−33−1>:7.4% all other components < 2.5% | 2.72 | 4.26 |
| N = 8 | (222 26.5 0):(−102)<−22−1>:3.42% all other components < 3% | 1.9 | 3.01 |

ROUTE D (WEAK INITIAL TEXTURE)

| | | | |
|---|---|---|---|
| Original (N = 0) | (80 25.2 45):(−113)<−8 −11 1>:4.3% Large spreading around (106) (119) | 2.6 | 3.2 |
| N = 1 | (0 46.7 45):(−334)<2−23>:5.8% | 4.02 | 6.3 |

TABLE 1-continued

| Number of passes N | Major Texture Orientations Notation: Euler angles (αβγ):{xyz}<uvw>:% total volume with 5° spread | OD index (t.r.) | Maximum of Pole Figures (t.r.) |
|---|---|---|---|
| N = 2 | (221 26.5 0):(-102)<-22-1>:5%<br>(128 18.4 0):(-103)<-3-4-1>:4.01%<br>(241 26.5 0):(-102)<-24-1>:12.72%<br>(26.5 48.2 26.5):(-212)<1-22>:4.1% | 5 | 6.7 |
| N = 3 | (197 20.~ 26.5):(-216)<-22-1>:8.8%<br>(26.5 48.2 26.5):(-212)<1-22>:3.9% | 3.5 | 6.44 |
| N = 4 | (221.8 26.5 0):(-102)<-22-1>:7.2%<br>(26.5 48.2 26.5):(-212)<1-22>:3.1% | 3 | 5.3 |

Table 2 describes major components of features between 1 and 8 ECAE passes via route A through D for a strong initial texture and after annealing at (150C, 1 h), (225C, 1 h) and (300C, 1 h)

TABLE 2

N Annealing at (150 C, 1 h)   Annealing at (225 C, 1 h)   Annealing at (300 C, 1 h)
Notations: Euler angles (αβγ): {xyz} <uvw>: % total volume with 5° spread Major texture orientations for route A
in function of number of passes N and annealing temperature
ROUTE A (STRONG INITIAL TEXTURE)

| N | Annealing at (150 C, 1 h) | Annealing at (225 C, 1 h) | Annealing at (300 C, 1 h) |
|---|---|---|---|
| 1 | (43 47 22):(-525)<1-32>:10.4%<br>(110 26.5 0):(-102)<-2-6-1>:8.04%<br>(130 24 18.4):(-317)<-3-2-1>:7.15% | (35 48 25):(-212)<1-22>:13.15%<br>(114 22 10):(-102)<-2-4-1>:9.3% | (76 29.5 45):(-225)<-5-71>:9.3%<br>(141 37 0):(-304)<-4-4-3>:6.6% |
| 2 | (105 22 0):(-205)<-5 20-2>:9.21%<br>(155 19.5 45):(-114)<-31-1>:7.83%<br>(31 36.7 45):(-213)<3-64>:6.88% | (136 18.4 0):(-103)<-3-3-1>:20.9%<br>(112 19 18.4):(-319)<-5-6-1>:20.2% | (354 18.4 0):(-103)<913>:7.74%<br>(315 11.5 45):(-117)<701>:7.38%<br>(90 7 0):(-108)<0-10>:6.7% |
| 3 | (110 36 16):(-7 2 10)<-4-9-2>:15.2%<br>(233 26.5 0):(-102)<-23-1>:7.35% | (110 45 0):(-101)<-1-4-1>:16.85%<br>(290 45 0):(-101)<141>:11.5% | Large spreading around (117),(100)<br>All components < 4% |
| 4 | (129 18 26):(-217)<-1-5-1>:11.73%<br>(35 37 26.5):(-213)<2-53>:11.2% | (124 25 14):(-419)<-3-3-1>:12.4%<br>(38 36.7 26.5):(-213)<3-95>:7.5% | (110 25.2 45):(-113)<-6-3-1>:6.87%<br>(318 25.2 45):(-113)<301>:5.1% |
| 6 | (180 19.5 45):(-114)<-22-1>:5.5%<br>(135 10 0):(-106)<-6-6-1>:4%<br>(0 46.7 45):(-334)<2-23>:3.95% | Large spreading<br>All components < 5% | (46.7 19.5 45):(-114)<-1-17 4>:9%<br>All components < 4.9% |
| 8 | Large spreading around (315),(104)<br>All components < 4% | (44 36 26.5):(-213)<2-63>:7.94%<br>(136 18.4 0):(-103)<-3-3-1>:6.17% | (152 32 0):(-508)<-8-5-5>:6.4%<br>All components < 3% |

Major texture orientations for route B
in function of number of passes N and annealing temperature
ROUTE B (STRONG INITIAL TEXTURE)

| N | Annealing at (150 C, 1 h) | Annealing at (225 C, 1 h) | Annealing at (300 C, 1 h) |
|---|---|---|---|
| 1 | (43 47 22):(-525)<1-32>:10.4%<br>(110 26.5 0):(-102)<-2-6-1>:8.04%<br>(130 24 18.4):(-317)<-3-2-1>:7.15% | (35 48 25):(-212)<1-22>:13.15%<br>(114 22 10):(-102)<-2-4-1>:9.3% | (76 29.5 45):(-225)<-5-71>:9.3%<br>(141 37 0):(-304)<-4-4-3>:6.6% |
| 2 | (215 20 26.5):(-216)<-36-2>:35%<br>(270 13.2 45):(-116)<110>:16% | (112 34 0):(-203)<-3-9-2>:16%<br>(16 54.7 45):(-111)<1-34>:8.88% | (221 26.5 0):(-102)<-22-1>:13.3%<br>(109 14 0):(-104)<-4-112-1>:12% |
| 3 | (148 19 79):(-1 5 15)<-55-2>:17.5%<br>(90 16 45):(-115)<-1-10>: | (10 45 10):(-616)<3-13>:5.7%<br>(235 14 0):(-104)<46-1>:4.53% | (0 48 26.5):(-212)<4-25>:6%<br>(222 41 45):(-223)<03-2>:5.8% |

TABLE 2-continued

| N | Annealing at (150 C, 1 h) | Annealing at (225 C, 1 h) | Annealing at (300 C, 1 h) |
|---|---|---|---|
| | Notations: Euler angles (αβγ): {xyz} <uvw>: % total volume with 5° spread | | |
| | 6.9% | Large spreading | (19.5 45 0):(−101)<2−12>:5.4% |
| 4 | (127 26.5 0):(−102)<−2−3−1>:5.9% | (230 14 0):(−104)<−45−1>:6.23% | Large spreading around (107) (115) |
| | (242 14 0):(−104)<−4 8 −1>: | | All components < 3% |
| 6 | (180 19.5 45):(−114)<−22−1>:5.5% | Large spreading All components < 5% | (46.7 19.5 45):(−114)<−1−17 4>:9% |
| | (135 10 0):(−106)<−6−6−1>:4% | | All components < 4.9% |
| | (0 46.7 45):(−334)<2−23>:3.95% | | |
| 8 | Large spreading around (315), (104) | (44 36 26.5):(−213)<2−63>:7.94% | (152 32 0):(−508)<−8−5−5>:6.4% |
| | All components < 4% | (136 18.4 0):(−103)<−3−3−1>:6.17% | All components < 3% |

Major texture orientations for route C
in function of number of passes N and annealing temperature
ROUTE C (STRONG INITIAL TEXTURE)

| N | Annealing at (150 C, 1 h) | Annealing at (225 C, 1 h) | Annealing at (300 C, 1 h) |
|---|---|---|---|
| 1 | (43 47 22):(−525)<1−32>:10.4% | (35 48 25):(−212)<1−22>:13.15% | (76 29.5 45):(−225)<−5−71>:9.3% |
| | (110 26.5 0):(−102)<−2−6−1>:8.04% | (114 22 10):(−102)<−2−4−1>:9.3% | (141 37 0):(−304)<−4−4−3>:6.6% |
| | (130 24 18.4):(−317)<−3−2−1>:7.15% | | |
| 2 | (191 16 45):(−115)<−23−1>:8.77% | (99 46 14):(−414)<−3−8−1>:20.9% | Large spreading around (100) |
| | (156 26.5 0):(−102)<−2−1−1>:6.68% | (289 45 0):(−101)<141>:15.22% | All components < 3.8% |
| 3 | (119 26.50):(−102)<−2−4−1>:28.4% | (106 29 26.5):(−214)<−5−6−1>:19.5% | (194 14 0):(−104)<−41−1>:6.1% |
| | (26.5 48 26.5):(−212)<1−22>:9.74% | (103 31 34):(−326)<−6−6−1>:18.7% | (163 18.4 0):(−103)<−3−1−1>:5.85% |
| | | (42 46.5 18.4):(−313)<1−32>:8.83% | |
| 4 | 105 38 18.5):(−314)<−3−5−1>:10.2% | Large spreading around (302) and (225) | Large spreading around (100) (105) (116) |
| | Other components <5.3% | All components <2.8% | All components <4.1% |
| 5 | (103 32 18.4):(−3 1 5)<−4−7−1>:19% | (127 26.5 0):(−102)<−2−3−1>:7% | Large spreading around (106) (115) |
| | | (22 38 18.4):(−314)<1−11>:5.6% | All components < 3.7% |
| 6 | (61 46 14):(−414)<1−83>:11.82% | Large spreading around (101) and (334) | (80 25 45):(−113)<−8−11 1>:4.3% |
| | (155 21 18.4):(−318)<−22−1>:7.94% | All components < 4% | All components < 3% |
| 7 | (104 36 16):(−7 2 10)<−3−6−1>:29% | (125 37 0):(−304)<−47−3>:7.8% | Large spreading around (100) (105) (203) |
| | (26.5 48 26.5):(−212)<1−22>:7.6% | (305 45 0):(−101)<121>:5.82% | All components <2.9% |
| 8 | (104 47 22):(−525)<−3−5−1>:15.36% | (106 38 18.4):(−314)<−3−5−1>:4.64% | Large spreading around (100) (105) (112) (203) |
| | | All components <3.2% | All components <2.7% |

Major texture orientations for route D
in function of number of passes N and annealing temperature
ROUTE D (STRONG INITIAL TEXTURE)

| N | Annealing at (150 C, 1 h) | Annealing at (225 C, 1 h) | Annealing at (300 C, 1 h) |
|---|---|---|---|
| 1 | (43 47 22):(−525)<1−32>:10.4% | (35 48 25):(−212)<1−22>:13.15% | (76 29.5 45):(−225)<−5−71>:9.3% |
| | (110 26.5 0):(−102)<−2−6−1>:8.04% | (114 22 10):(−102)<−2−4−1>:9.3% | (141 37 0):(−304)<−4−4−3>:6.6% |
| | (130 24 18.4):(−317)<−3−2−1>:7.15% | | |
| 2 | (215 21 26.5):(−216)<−36−2>:35% | (112 34 0):(−203)<−3−9−2>:16% | (222 26.5 0):(−102)<−22−1>:13.3% |
| | (270 13 45):(−116)<110>:16% | (16 54.7 45):(−111)<1−34>:8.88% | (109 14 0):(−104)<−4−112−1>:12% |
| | | | (162 9 45):(−119)<−63−1>:9.6% |
| 3 | (337 50 34):(−323)<101>:12.2% | (168 20 25):(−216)<−82−3>:10.35% | (150 16 45):(−115)<115><−41−1>:5.6% |
| | (215 47 45):(−334)<0 4−3>:9.75% | (102 18.4 0):(−103)<−3−16 −1>:9.32% | (198 18.4 0):(−103)<−31−1>:5.2% |
| | (241 26.5 0):(−102)<−24−1>:7.02% | (162 13 45):(−116)<−42−1>:6.44% | |

TABLE 2-continued

| N | Annealing at (150 C, 1 h) | Annealing at (225 C, 1 h) | Annealing at (300 C, 1 h) |
|---|---|---|---|
| | Notations: Euler angles (αβγ): {xyz} <uvw>: % total volume with 5° spread | | |
| 4 | (233 26.5 0):(−102)<−23−1>:9% | Large spreading | Large spreading |
| | All other components <4% | All components <3.6% | around (105) (116) |
| | | | All components < 3.9% |
| 6 | (224 18.4 0):(−103)<−33−1>:8.29% | (224 18.4 0):(−103)<−33−1>:5.49% | Large spreading |
| | All other components <3.8% | (109 18.4 0):(−103)<−3−9−1>:4.4% | around (106) and (113) |
| | | | All components < 2.9% |
| 8 | (222 27 0):(−102)<−22−1>:8.58% | (205 21 18.4):(−138)<−22−1>:11.44% | (222 26.5 0):(−102)<−22−1>:8.58% |
| | All components <4% | (233 26.5 0):(−102)<−23−1>:10.74% | (38 16 45):(−115)<1−92>:5.55% |

Figure 5:
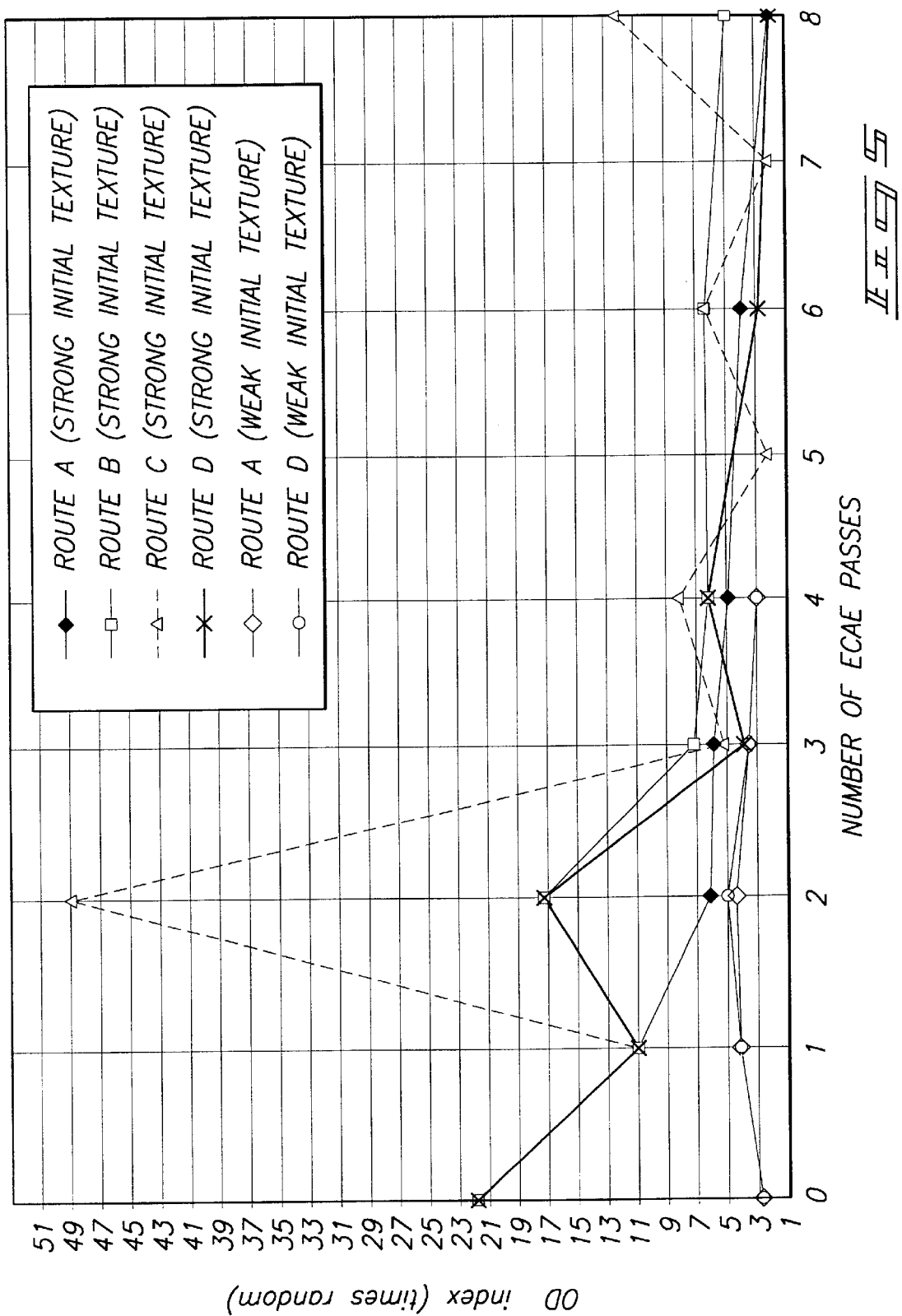
FIG. 5 is a graph showing the effect of number of passes and route on texture intensity after ECAE of Al with 0.5 wt. % Cu.
Figure 6:
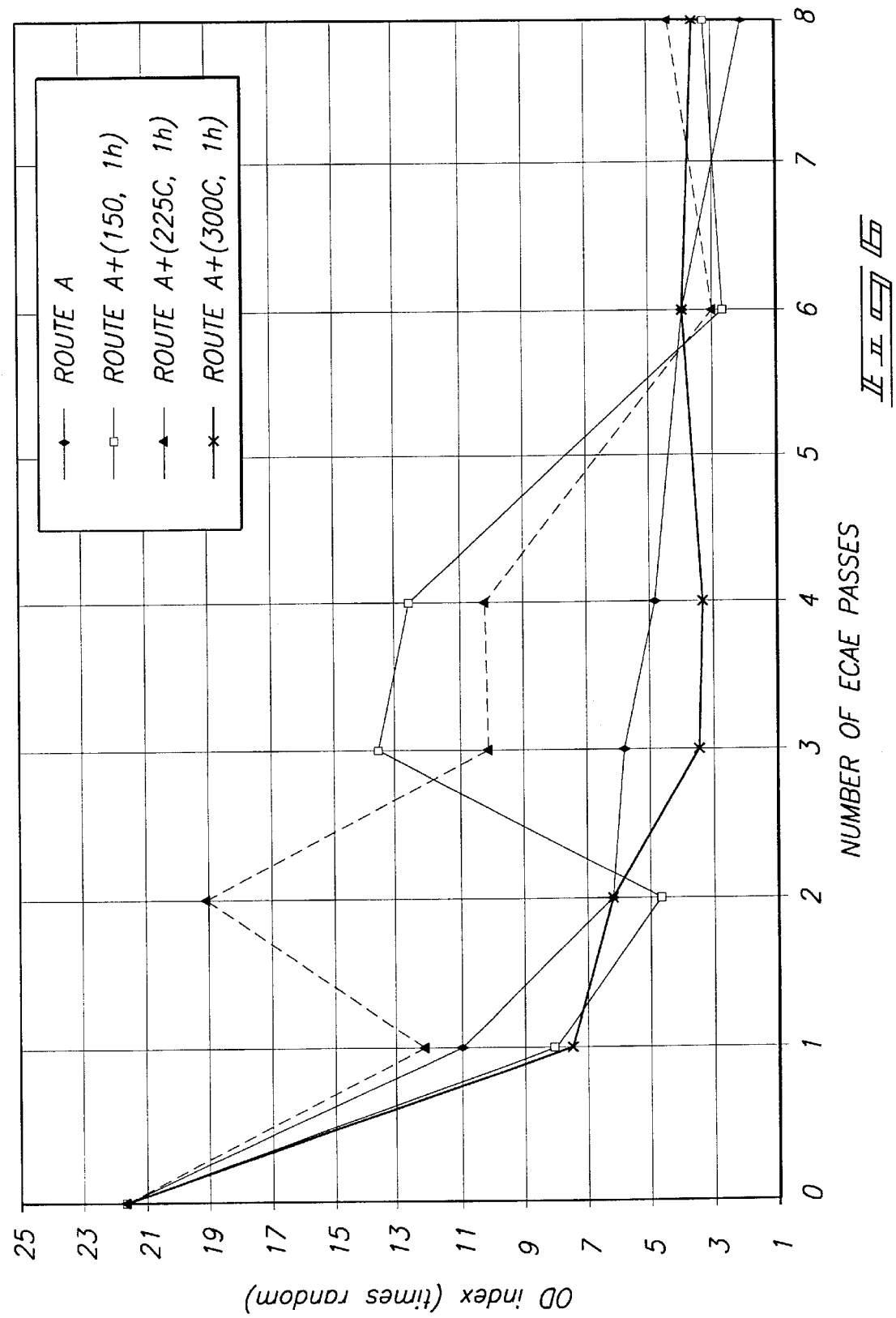
FIG. 6 is a graph showing the effects of annealing temperature for route A after ECAE of Al with 0.5 wt. % Cu.
Figure 7:
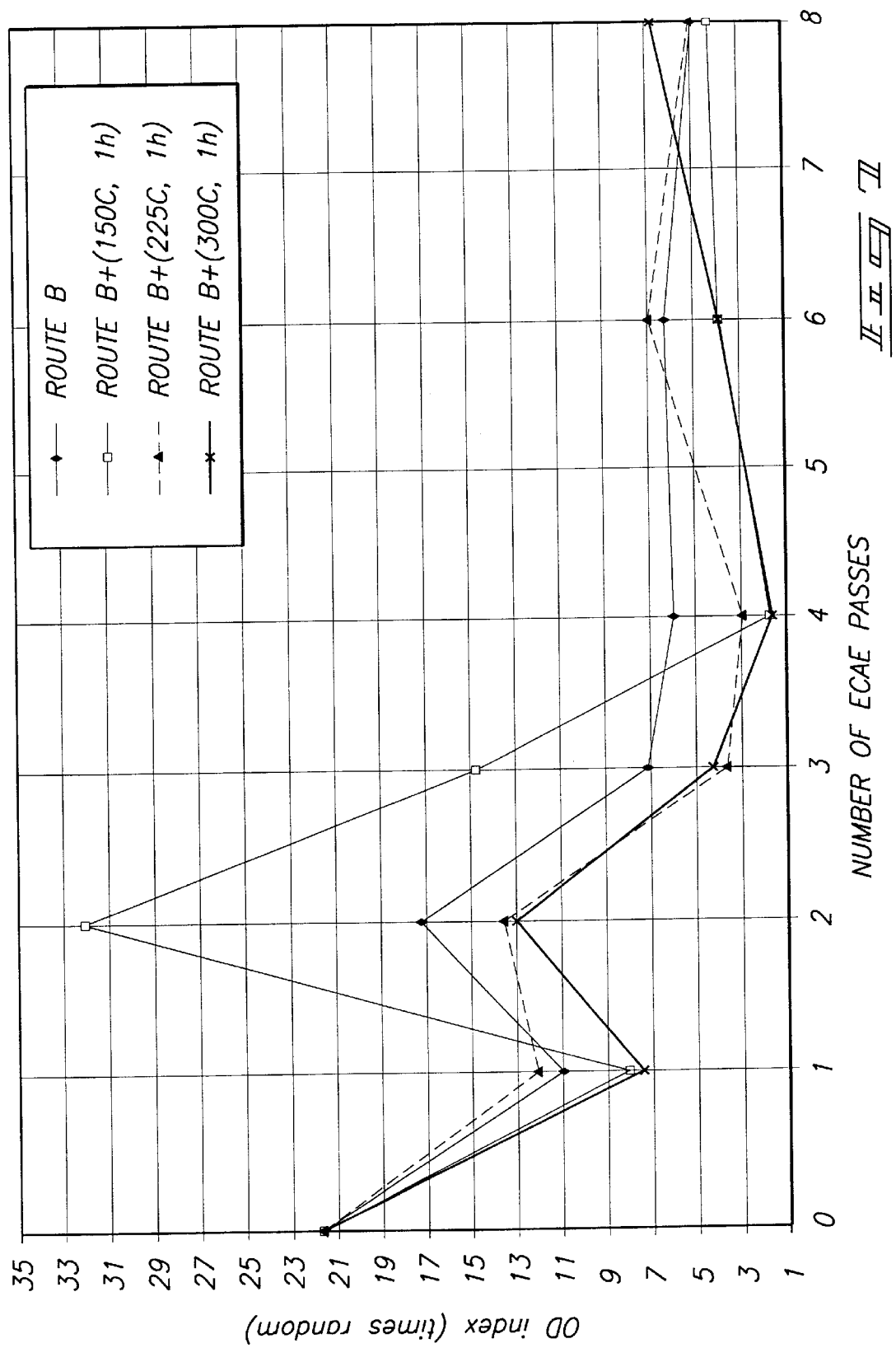
FIG. 7 is a graph showing the effects of annealing temperature on texture intensity for route B after ECAE of Al with 0.5 wt. % Cu.
Figure 8:
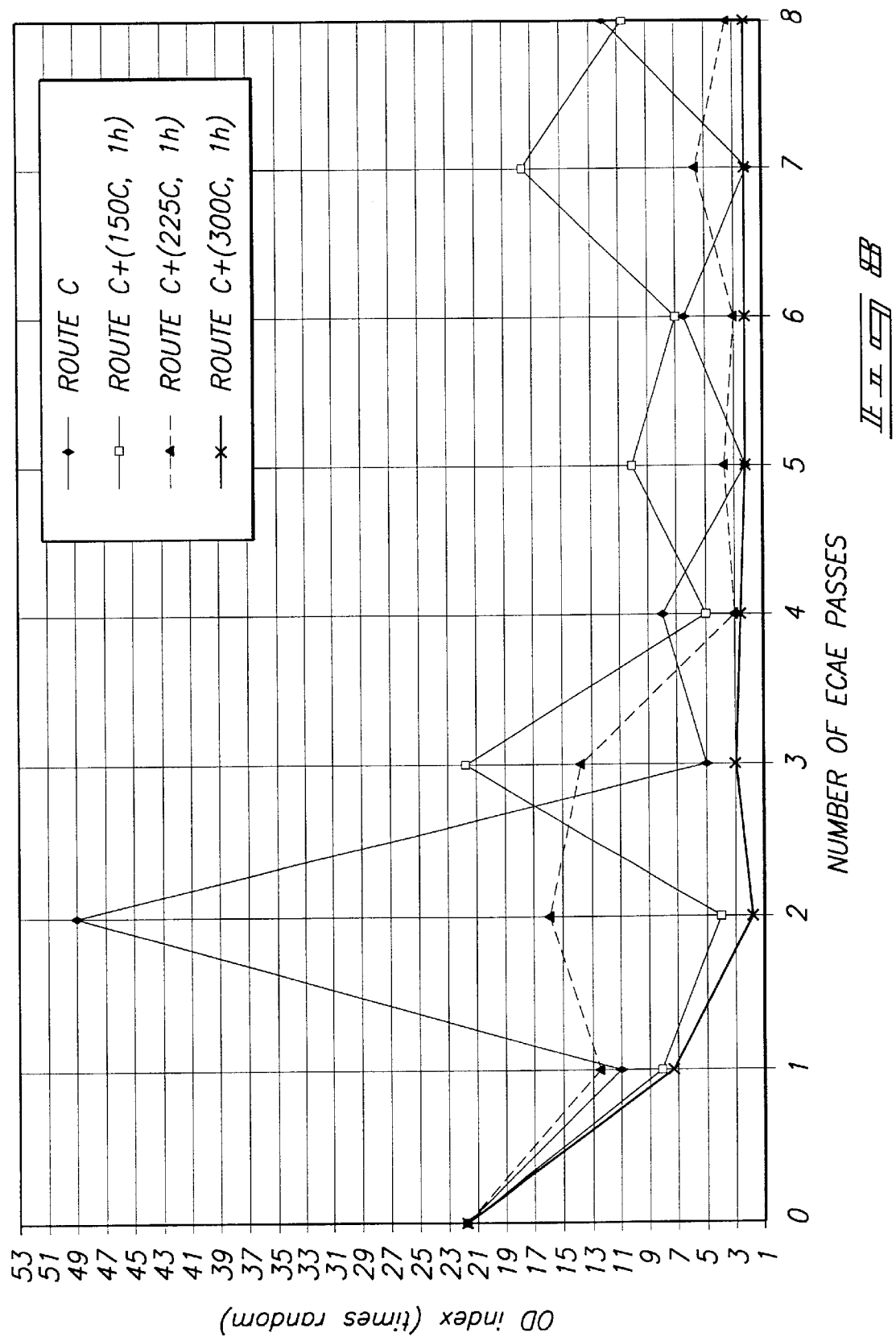
FIG. 8 is a graph showing the effects of annealing temperature on texture intensity for route C after ECAE of Al with 0.5 wt. % Cu.
Figure 9:
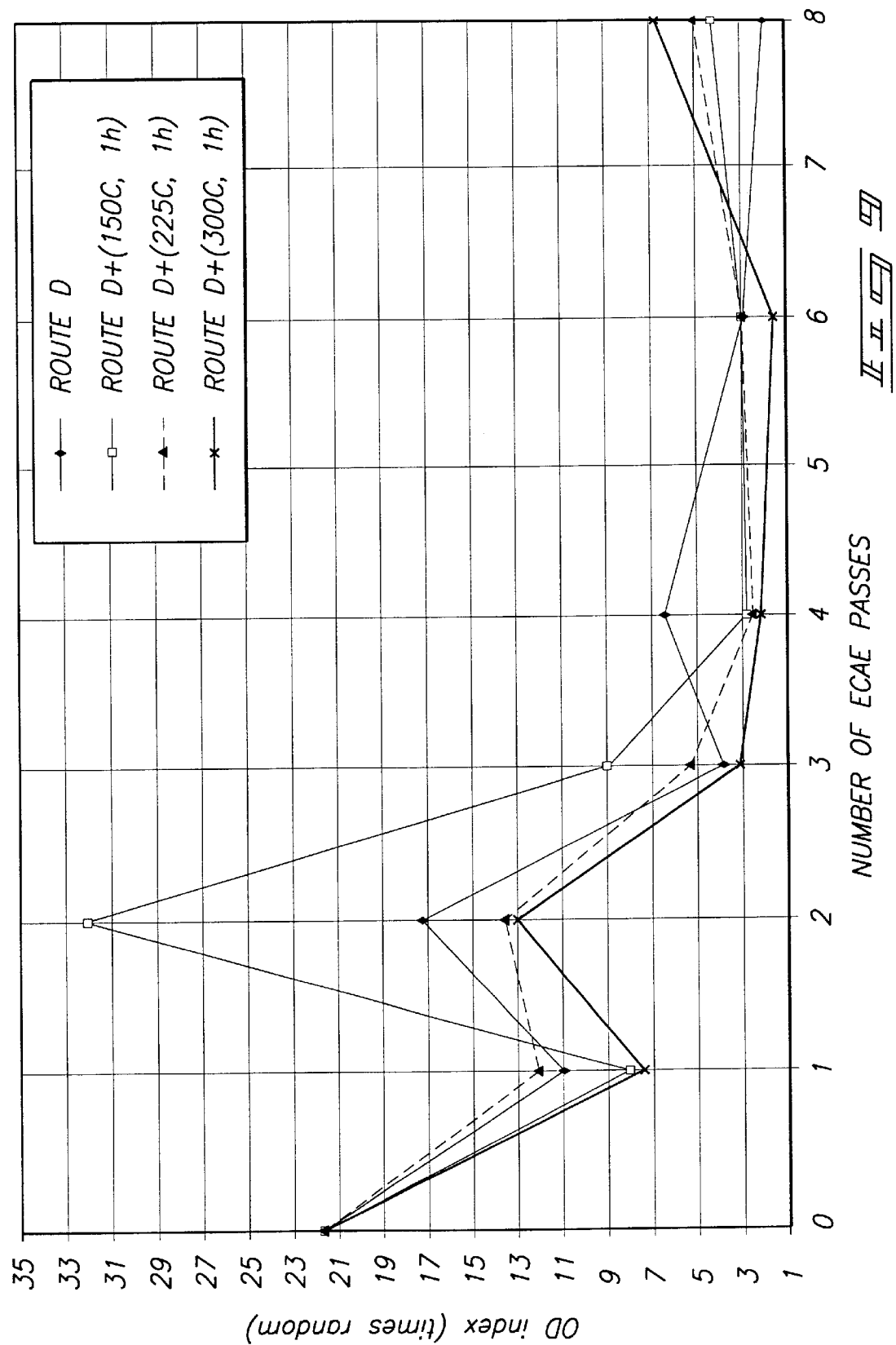
FIG. 9 is a graph showing the effects of annealing temperature on texture intensity for route D after ECAE of Al with 0.5 wt. % Cu.

(1) The number of ECAE passes permits the control of texture strength. The increase of the number of passes is an efficient mechanism of randomizing texture. There is an overall decrease of texture strength evidenced by the creation of new orientations and, more importantly, the large spreading of orientations around the major components of the texture as evidenced in FIG. 4. FIG. 4 is an illustration of (200) pole figures for Al with 0.5 wt. % Cu alloys processed 2, 4 and 8 passes of route D (FIG. 5) and shows spreading of orientations as "N" increases. This phenomenon is more or less effective depending on the investigated route and/or annealing treatment. For example in the as-deformed state, routes B and C result in somewhat higher textures than routes A and D (FIG. 5 and Table 1). FIG. 5 is a graph that shows the influence of ECAE deformation route and strength on texture formation as a function of number of ECAE passes. For medium to very strong starting textures, two main areas can be distinguished in the as-deformed state (FIG. 5):

Between passes 1 and 4 (with a tool angle of 90°), very strong to medium textures are obtained. In the investigation of A1.5 Cu, for example, the OD index ranges from more than 7 times random to more than 48 times random which corresponds to maximum intensities of the ODF between 3000 mrd (30 times random) and more than 20000 mrd (200 times random).

For more than 4 passes (with a tool angle of 90°), medium-strong to very weak textures close to random are created. In the case of A1.5 Cu alloys, OD index varies from around 11 times random to less than 1.9 times random depending on the route, which corresponds to maximum intensities of the ODF between 7000 mrd (70 times random) and around 800 mrd (8 times random).

The two main domains are maintained after subsequent annealing, as shown in the graphs of FIGS. 6, 7, 8 and 9. However for some ECAE deformation routes (for example route B and C in the case of A1.5 Cu), additional heating can give a strong texture, as discussed below. The existence of these two areas is a direct consequence of the microstructural changes occurring in the material during intensive plastic deformation. Several types of defects (dislocations, microbands, shear bands and cells and sub-grains inside these shear bands) are gradually created during the 3 to 4 ECAE passes (for a tool angle of 90°). The internal structure of materials is divided into different shear bands while increasing the number of passes. After 3 to 4 ECAE passes, a mechanism termed dynamic recrystallization occurs and promotes the creation of sub-micron grains in the structure. As the number of passes increases these grains become more and more equiaxed and their mutual local mis-orientations increase giving rise to a higher number of high angle boundaries in the structure. The very weak and close to random textures that are created are a consequence of three major characteristics of the dynamically recrystallized microstructures: the presence of high internal stresses at the grain boundaries, the large number of high angle boundaries and the very fine grain size with a large grain boundary area (usually of the order of about 0.1–0.5 $\mu$m).

(2) The ECAE deformation route permits control of the major orientations of the texture. Depending on the route, different shear planes and directions are involved at each pass (see FIG. 5 and Tables 1 and 2). Therefore shear bands of different orientations are created in the structure. For some routes these shear bands always intersect each other in the same way; for other routes new families are constantly introduced at each pass (Tables 1 and 2). All these options allow changes to the major components or orientations between each pass. The effect is particularly strong for a small number of passes before the advent of dynamic recrystallization, as discussed above. An important application exists in the possibility to create different types of strong textures already in the as-deformed state for a limited number of ECAE passes.

(3) Additional annealing has an important influence on both the major texture orientations and strength (see FIGS. 6, 7, 8, 9 and Table 2).

For annealing temperatures below the static recrystallization, a change in both texture strength and main orientation is observed. This effect can be particularly strong for a low number of passes (less than about 4 passes) leading to remarkable migrations of major orientations accompanied with either a decrease or increase of texture strength. Such changes can be attributed to the instability of microstructural defects which are implemented in the crystal structure. Complex mechanisms such as recovery and sub-grain coalescence explain partly the observed phenomena. For dynamically recrystallized ultra-fine structure (after usually 4 passes) smaller modifications are encountered. They are usually associated with the transition from a highly stressed to a more equilibrium micro structure.

For annealing temperatures close to the beginning of static recrystallization, the same over-all results as in the above case are found. However, it is important to note that new and different textures than for low temperature annealing can be obtained, especially for a low number of ECAE passes (Table 2). This is due to static recrystallization which creates new grains with new orientations by diffusion mechanisms.

For annealing temperatures corresponding to developed stages of static recrystallization (full static recrystallization), textures tend to be weakened (as shown in FIGS. 6, 7, 8, 9 and Table 2). This is particularly true after 3 or 4 ECAE passes where very weak and almost random textures are created. These textures are characterized by four, six or eight fold symmetry with a higher number of cube (<200>) components.

Figure 10:
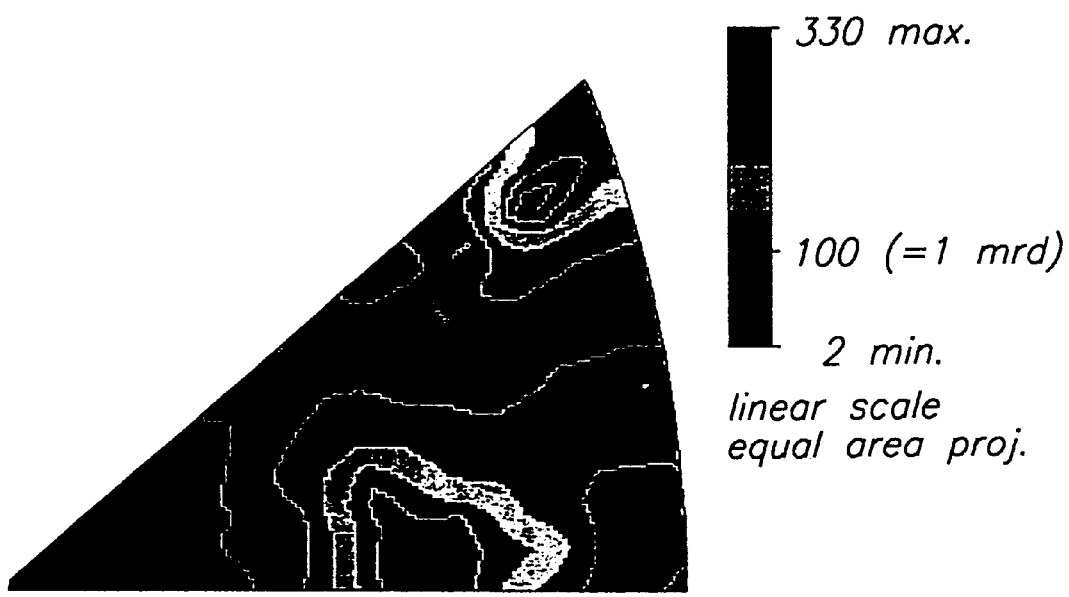
FIG. 10 is a pole figure illustrating the texture as a result of the process described.

Additional textural analysis of ECAE deformed Al and 0.5 wt. % Cu is shown in the pole figure described in FIG. 10. In this case the sample was given an initial thermochemical treatment of casting plus homogeneous plus hot forging plus cold rolling (~10%) plus two ECAE passes via route C plus annealing (250° C., 1 hour). The recrystallized microstructure had grain size of 40–60 μm and strong texture along {−111}<2−12>, {012}<−130>, {−133}<3−13>. The result shows two ECAE passes (C) plus static recyrstalization permits removal of the very strong (220) textural component of the as-forged condition.

By taking into account all the foregoing, results show that intermediate annealing between each pass provides several additional and significant opportunities to adjust desired textures. Two options are available:

A. Intermediate annealing either at low temperature or just at the beginning of static recrystallization after a low number of passes (N<4) can give strong textures with new orientations after subsequent deformation with or without annealing.

B. Intermediate annealing in the case of full static recrystallization after a low or high number of passes can lead more easily to very weak textures after subsequent deformation with or without annealing.

It is also possible to repeat intermediate annealing several times in order to enhance the effects described above.

(4) Starting texture has also a strong influence on both texture and strength especially after a limited number of passes (usually after 1 to 4 passes). For a higher number of passes the ECAE deformation is very large and new mechanisms are taking place which lessen the magnitude of the influence of the starting texture. Two situations are noted (FIG. 5 and Table 1 for route A and D):

A. For a strong to medium starting textures, after further deformation with or without annealing, it is possible to obtain very strong to medium textures before 4 passes and strong-medium to very weak textures after approximately 4 passes according to the results described in paragraph 1, 2 and 3.

B. For medium to very weak starting textures it will be more difficult to obtain very strong to strong textures at least in the as-deformed state. Weak starting textures are more likely to enhance and promote weak to random textures after ECAE deformation with or without annealing (Table 1).

(5) Second phase particles have a pronounced effect on texture. Large (>1 μm) and non-uniformly distributed particles are not desired because they generate many problems such as arcing during sputtering. Very fine (>1 μm) and uniformly distributed second phase particles are of particular interest and offer many advantages. Firstly, they tend to create a more even stress-strain state during ECAE deformation. Secondly, they stabilize the already ECAE-deformed microstructure in particular after further annealing. In this case particles pin grain boundaries making them more difficult to change. These two major effects evidently affect the texture of materials. Especially:

for a small number of passes (<4 passes), the effects described previously in sections (1) to (4) can be enhanced due to the presence of second phase particles in particular for strong textures.

for a large number of passes, second phase particles are effective in promoting the randomization of texture.

In order to take advantage of the possibilities offered by the ECAE technique in terms of texture control, three types of results can be achieved:

A. Materials (sputtering targets) with strong to very strong (ODF>10000 mrd) textures. In particular this can be obtained for a small number of passes with or without subsequent annealing or intermediate annealing. A strong starting texture is a factor favoring the creation of strong textures. For example in the case of Al.5Cu alloy Table 1 gives all the major components of orientations which were created for different deformation routes (A,B,C,D) between 1 and 4 passes. The as-deformed state as well as deformation followed either by low temperature annealing (150° C., 1 h) or by annealing at the beginning of static recrystallization (225° C., 1 h) or after full recrystallization (300° C., 1 h) are considered in this table. The original texture is displayed in FIG. 7. It is important to note that in most cases new types of textures have been found. Not only {200} and {220} textures are present but also {111}, {140}, {120}, {130}, {123}, {133}, {252} or, for example, {146}. For strong textures, one or two main components are usually present.

B. Material (sputtering targets) with weak to close to random textures with an ultra-fine grain size less than lam. Whatever the route this can be obtained after more than 3 to 4 ECAE passes followed or not by annealing or intermediate annealing at a temperature below the beginning of recrystallization temperature. A very weak starting texture is a factor favoring the creation of close to random textures.

C. Statically recrystallized materials (sputtering targets) with weak to close to random textures with a fine grain size above approximately 1 μm. Whatever the route this can be obtained after more than 3 to 4 ECAE passes followed by annealing or intermediate annealing at a temperature above the beginning of recrystallization temperature. A very weak starting texture is a factor favoring the creation of close to random textures.

Another embodiment of the invention is an apparatus for performing the process to produce targets. The apparatus (FIGS. 11, 11A and 11B) includes die assembly 1, die base 2, slider 3, punch assembly 4, 6 hydraulic cylinder 5, sensor 7, and guide pins 11. Also the die is provided with heating elements 12. Die assembly 1 has a vertical channel 8. A horizontal channel 9 is formed between die assembly 1 and slider 3. The die is fixed at table 10 of press, punch assembly 4, 6 is attached to press ram. In the original position a—a the forward end of slider 3 overlaps channel 1, punch 4 is in a top position, and a well lubricated billet is inserted into the vertical channel. During a working stroke punch 4 moves down, enters channel 8, touches the billet and extrudes it into channel 9. Slider 3 moves together with billet. At the end of stroke the punch reaches the top edge of channel 9 and then returns to the original position. Cylinder 5 moves the slider to position b—b, releases the billet, returns the slider to the position a—a and ejects the processed billet from the die. The following features are noted:

(a) During extrusion slider 3 is moved by hydraulic cylinder 5 with the same speed as extruded material inside channel 9. To control speed, the slider is provided with sensor 7. That results in full elimination of friction and material sticking to the slider, in lower press load and effective ECAE;

(b) Die assembly 1 is attached to die base 2 by guide pins 11 which provide free run δ. During extrusion the die assembly is nestled to the base plate 2 by friction acted inside channel 8. When the punch returns to the original position, no force acts on the die assembly and slider, and cylinder 3 can easily move the slider to position b—b and then eject the billet from the die.

(c) Three billet walls in the second channel are formed by the slider (FIG. 11A) that minimizes friction in the second channel.

(d) The side walls of the second channel in the slider are provided with drafts from 5° to 12°. In this way the billet is kept inside the slider during extrusion but may be ejected from the slider after completing extrusion. Also, thin flash formed in clearances between the slider and die assembly may be easily trimmed.

(e) Die assembly is provided with heater 12 and springs 13. Before processing, springs 13 guarantee the clearance δ between die assembly 1 and die base 2. During heating this clearance provides thermoisolation between die assembly and die base that results in short heating time, low heating power and high heating temperature.

The apparatus is relatively simple, reliable and may be used with ordinary presses.

We claim:

1. A method for fabricating an article, comprising:
   providing a cast ingot;
   homogenizing said ingot for a time and temperature sufficient for redistribution of macrosegregations and microsegregations;
   subjecting said ingot to from 1 to 3 passes of equal channel angular extrusion;
   intermediate annealing the ingot to produce precipitates of average diameter of less than about 0.1 um; and
   after the intermediate annealing, subjecting the ingot to at least one additional pass of equal channel angular extrusion to refine grains therein.

2. A method according to claim/further comprising, after subjecting said ingot to equal channel angular extrusion to refine the grains therein manufacturing same to produce a sputtering target.

3. A method according to claim 1 wherein said ingot is subject to a total of 4 to 6 passes of equal channel angular extrusion.

4. A method according to claim 1 further comprising and post-extrusion annealing.

5. The method of claim 4 wherein the post-extrusion annealing comprises recovery annealing.

6. The method of claim 1 wherein the ingot comprises a material having a beginning temperature of static recrystallization, and wherein the intermediate annealing comprises intermediate annealing at the beginning temperature of static recrystallization.

7. The method of claim 1 wherein the ingot comprises a material having a beginning temperature of static recrystallization, and wherein the intermediate annealing comprises intermediate annealing above the beginning temperature of static recrystallization.

8. The method of claim 1 wherein the ingot comprises a material having a beginning temperature of static recrystallization, and wherein the intermediate annealing comprises intermediate annealing below the beginning temperature of static recrystallization.

9. A method of making a sputtering target comprising:
   providing a cast ingot with a length-to-diameter ratio up to 2;
   hot forging said ingot to eliminate cast defects, the hot forging forming the ingot into a hot forged product;
   forming an extruded material by subjecting said hot forged product to a plurality of equal channel angular extrusion passes and at least one intermediate anneal between passes to produce fine precipitates within the extruded material; and
   manufacturing the extruded material into a sputtering target.

10. A method according to claim 9 further comprising a solutionizing heat treatment prior to the equal channel angular extrusion.

11. A method according to claim 9 further comprising:
   heating the cast ingot before hot forging at a temperature and for a time sufficient for solutionizing;
   wherein the hot forging is at a temperature above the temperature of the solutionizing; and
   water quenching the forged billet immediately after the hot forging.

12. The method of claim 9 wherein the hot forged product is fabricated into a square billet prior to the equal channel angular extrusion; the ingot initially being a cast ingot of diameter $d_o$ and length $h_o$; the hot forging of the ingot forming the hot forged product in the shape of a forged disc of diameter $d_o$ and thickness $h_o$ and from which two segments from two opposite sides of the hot forged product are removed in such a manner to form the square billet having thickness H corresponding to the thickness of the billet for equal channel angular extrusion and the width A corresponding to the dimension of the square billet for equal channel angular extrusion, the dimensions of the cast ingot and the forged billet being related by the formulae:

$$D=1.18A$$

$$d_o^2 h_o = 1.39 A^2 H.$$

13. A method according to claim 9 in which the ingot comprises a material having a temperature of static recrystallization; and in which the equal channel angular extrusion is performed at a temperature below the temperature of static recrystallization and at a speed sufficient to provide uniform plastic flow, and under conditions which provide dynamic recrystallization during the equal channel angular extrusion.

14. A method according to claim 9 further comprising post-extrusion annealing.

15. The method of claim 14 wherein the post-extrusion annealing comprises recovery annealing.

16. The method of claim 15 wherein the sputtering target comprises an average grain size of less than 1 micron.

17. The method of claim 9, wherein the ingot comprises a material having a beginning temperature of static recrystallization, and wherein the intermediate annealing comprises intermediate annealing at the beginning temperature of static recrystallization.

18. The method of claim 9 wherein the ingot comprises a material having a beginning temperature of static recrystallization, and wherein the intermediate annealing comprises intermediate annealing above the beginning temperature of static recrystallization.

19. The method of claim 9 wherein the sputtering target comprises an average grain size of greater than or equal to about 1 micron.

20. The method of claim 9 wherein the ingot comprises a material having a beginning temperature of static recrystallization, and wherein the intermediate annealing comprises intermediate annealing below the beginning temperature of static recrystallization.

21. A method of fabricating an article comprising:
   providing a cast ingot, the cast ingot comprising a cast ingot material;

solutionizing heat treating said cast ingot material at a first temperature and for a time sufficient to dissolve all precipitates and particle bearing phases;

homogenizing the ingot;

hot forging of the ingot to produce a hot forged ingot;

equal channel angular extruding the hot forged ingot at a temperature below the first temperature to produce an extruded material;

producing a sputtering target from the extruded material; and annealing after forming the sputtering target, the annealing comprising gradient annealing performed by exposing a surface of the sputtering target to a heating condition and exposing an opposite target surface to a cooling condition.

22. A method according to claim 21 in which the gradient annealing of the target is performed directly in a sputtering machine at sputtering conditions before starting a production run.

23. A method of making a sputtering target comprising:

providing a cast ingot with a length-to-diameter ratio up to 2;

hot forging said ingot to eliminate cast defects, the hot forging forming the ingot into a hot forged product;

subjecting said hot forged product to equal channel angular extrusion to form the hot forged product into an extruded material, the equal channel angular extrusion including a first extrusion with 1 to 5 passes at least two different directions and a second extrusion with a sufficient number of passes to develop a dynamically recrystallized structure;

d. the method further comprising intermediate annealing between the first and second extrusions, the intermediate annealing producing precipitates of average diameter less than about 0.1 $\mu$m; and e. manufacturing the extruded material into a sputtering target.

24. A method for fabricating an article, comprising:

providing an ingot;

subjecting said ingot to from four to six passes of equal channel angular extrusion to form an extruded material;

intermediate annealing between at least some of the 4 to six passes to produce precipitates within the extruded material; and manufacturing the extruded material into a sputtering target.

25. The method of claim 24 wherein the sputtering target has an average gain size of less than one micron.

26. The method of claim 24 wherein the sputtering target has an average grain size greater than or equal to 1 micron.

27. The method of claim 24 wherein the manufacturing produces a monolithic target.

28. The method of claim 24 wherein the ingot comprises at least one of Al, Ti, Cu, Ni, Mo, Au, Ag, and Pt.

29. The method of claim 24 wherein the ingot consists essentially of a high-purity metal selected from the group consisting of aluminum, copper, gold, platinum, nickel, and titanium.

* * * * *

UNITED STATES PATENT AND TRADEMARK OFFICE
CERTIFICATE OF CORRECTION

PATENT NO. : 6,723,187 B2
APPLICATION NO. : 09/912476
DATED : April 20, 2004
INVENTOR(S) : Valdimir Segal et al.

It is certified that error appears in the above-identified patent and that said Letters Patent is hereby corrected as shown below:

Col. 3, line 64, please delete "do" before "and" and insert --$d_o$--.

Col. 11, Table 2, Route C, Column Annealing at (150C, 1h) entry 3, please delete "(119 26.50)" and insert --(119 26.5 0)--.

Col. 11, Table 2, Route D, Column Annealing at (225C, 1h) entry 2, please delete "16%" and insert --16.45%--.

Col. 11, Table 2, Route D, Column Annealing at (300C, 1h) entry 2, please delete "112- 1>:12%" and insert --12-1>:12%--.

Col. 16, line 26, please delete "Iam." before "Whatever" and insert --1μm.--.

Col. 17, line 35, claim 2, please delete "claim/further" after "to" and insert --claim 1 further--.

Col. 20, line 17, claim 25, please delete "gain" after "average" and insert --grain--.

Col. 20, line 23, claim 28, please insert --Ta,-- after "Cu,".

Signed and Sealed this

Nineteenth Day of December, 2006

JON W. DUDAS
*Director of the United States Patent and Trademark Office*